(12) United States Patent
Wallace et al.

(10) Patent No.: US 6,291,866 B1
(45) Date of Patent: Sep. 18, 2001

(54) ZIRCONIUM AND/OR HAFNIUM OXYNITRIDE GATE DIELECTRIC

(75) Inventors: Robert M. Wallace, Richardson; Richard A. Stoltz, Plano; Glen D. Wilk, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/421,837

(22) Filed: Oct. 20, 1999

Related U.S. Application Data

(62) Division of application No. 09/115,773, filed on Jul. 15, 1998, now Pat. No. 6,013,553.
(60) Provisional application No. 60/053,616, filed on Jul. 24, 1997, and provisional application No. 60/053,617, filed on Jul. 24, 1997.

(51) Int. Cl.[7] .......................... H01L 29/76; H01L 29/94; H01L 31/062; H01L 31/113; H01L 31/119
(52) U.S. Cl. .......................... 257/410; 257/411; 257/310; 257/324
(58) Field of Search .................................. 257/310, 324, 257/368, 410, 411

(56) References Cited

U.S. PATENT DOCUMENTS

| | | |
|---|---|---|
| 3,895,966 | 7/1975 | MacDougall et al. . |
| 4,977,440 | * 12/1990 | Stevens ................................. 257/751 |
| 5,098,623 | 3/1992 | Pompe . |
| 5,173,835 | 12/1992 | Cornett et al. . |

(List continued on next page.)

FOREIGN PATENT DOCUMENTS

| | | |
|---|---|---|
| 4-305836-A | * 10/1992 | (JP) . |
| 5-305721-A | * 11/1993 | (JP) . |

OTHER PUBLICATIONS

U.S. Patent Application Serial No. 09/116,138 filed Jul. 15, 1998.*
U.S. Patent Application Serial No. 09/434,205 filed Nov. 4, 1999.*
L. Manchanda et al., "Gate Quality Doped High K Films for CMOS Beyond 100 nm: 3–10 nm Al/sub2/0/sub3/ with Low Leakage and Low Interface States," IEEE Electron Devices Meeting, IEDM '98 Technical Digest, Dec. 9, 1998, pp. 605–608.
H. Shimada et al., "Current Drive Enhancement by Using High–Permittivity Gate Insulator in SOI MOSFET's and its Limitation," IEEE Transactions on Electron Devices, vol. 43, No. 3, Mar. 1996, pp. 431–435.
H. Shimada et al., "Minimum Parasitic Resistance for Ultra–Thin SOI MOSFET with High–Permittivity Gate Insulator Performed by Lateral Contact Structure," Proceedings 1995 IEEE International SOI Conference, Oct. 1995, pp. 98–99.
A. Chatterjee et al., "CMOS Metal Replacement Gate Transistors Using Tantalum Pentoxide Gate Insulator," IEEE Electron Devices Meeting, IEDM '98 Technical Digest, Dec. 9, 1998, pp. 777–780. (Abstract).

(List continued on next page.)

Primary Examiner—Carl Whitehead, Jr.
Assistant Examiner—Jamie L. Brophy
(74) Attorney, Agent, or Firm—David Denker; Wade James Brady, III; Frederick J. Telecky Jr.

(57) ABSTRACT

A field effect semiconductor device comprising a high permittivity zirconium (or hafnium) oxynitride gate dielectric and a method of forming the same are disclosed herein. The device comprises a silicon substrate 20 having a semiconducting channel region 24 formed therein. A zirconium oxynitride gate dielectric layer 36 is formed over this substrate, followed by a conductive gate 38. Zirconium oxynitride gate dielectric layer 36 has a dielectric constant is significantly higher than the dielectric constant of silicon dioxide.

20 Claims, 2 Drawing Sheets

U.S. PATENT DOCUMENTS

| | | | |
|---|---|---|---|
| 5,187,636 | | 2/1993 | Nakao . |
| 5,464,683 | * | 11/1995 | Rudigier et al. .................... 428/216 |
| 5,504,041 | | 4/1996 | Summerfelt . |
| 5,528,068 | | 6/1996 | Ohmi . |
| 5,621,681 | | 4/1997 | Moon . |
| 5,736,267 | * | 4/1998 | Mitsui et al. ........................ 428/702 |
| 5,773,325 | | 6/1998 | Teramoto . |
| 5,786,078 | * | 7/1998 | Sekiya et al. ....................... 428/332 |
| 5,834,353 | | 11/1998 | Wu . |
| 5,851,896 | | 12/1998 | Summerfelt . |
| 5,874,766 | | 2/1999 | Hori . |
| 5,876,788 | | 3/1999 | Bronner et al. . |
| 5,880,006 | | 3/1999 | Lin et al. . |
| 5,880,508 | | 3/1999 | Wu . |
| 5,922,478 | * | 7/1999 | Welty et al. ........................ 428/621 |
| 5,923,056 | | 7/1999 | Lee et al. . |
| 5,980,977 | * | 11/1999 | Deng et al. .......................... 427/79 |
| 6,013,553 | | 1/2000 | Wallace et al. . |
| 6,020,243 | | 2/2000 | Wallace et al. . |
| 6,096,590 | * | 8/2000 | Chan et al. ......................... 438/233 |
| 6,183,846 | * | 2/2001 | Moriguchi et al. ................. 428/216 |

OTHER PUBLICATIONS

Yongjoo Jeon et al., "Effect of Barrier Layer on the Electrical and Reliability Characteristics of High–K Gate Dielectric Films," IEEE Electron Devices Meeting, IEDM '98 Technical Digest, Dec. 9, 1998, pp. 797–800.

Hsing–Huang Tseng et al., "Reduced Gate Leakage Current and Boron Penetration of 0.18 um 1.5 V MOSFETs Using Integrated RTCVD Oxynitride Gate Dielectric," IEEE Electron Devices Meeting IEDM '98 Technical Digest, Dec. 9, 1998, pp. 793–796.

C.T. Liu, "Circuit Requirement and Integration Challenges of Thin Gate Dielectrics for Ultra Small MOSFETs," IEEE Electron Devices Meeting, IEDM '98 Technical Digest, Dec. 9, 1998, pp. 747–750.

* cited by examiner

ZIRCONIUM AND/OR HAFNIUM OXYNITRIDE GATE DIELECTRIC

This application is a Divisional of application Ser. No. 09/115,773 filed Jul. 15, 1998, now U.S. Pat. No. 6,013,553, which claims priority under 35 USC § 119(e)(1) of Provisional Application Nos. 60/053,616 filed Jul. 24, 1997 and 60/053,617 filed Jul. 24, 1997.

FIELD OF THE INVENTION

This invention relates generally to semiconductor device structures and methods for forming such, and more specifically to such structures and methods related to gate dielectrics for field effect devices formed on integrated circuits.

BACKGROUND OF THE INVENTION

Semiconductor devices such as field effect transistors are common in the electronics industry. Such devices may be formed with extremely small dimensions, such that thousands or even millions of these devices may be formed on a single-crystal silicon substrate or "chip" and interconnected to perform useful functions in an integrated circuit such as a microprocessor.

Although transistor design and fabrication is a highly complex undertaking, the general structure and operation of a transistor are fairly simple. With reference to FIG. 1, a simplified field effect transistor is shown in cross-section. In a field effect transistor a portion of the substrate (or epilayer) 100 near the surface is designated as the channel 120 during processing. Channel 120 is electrically connected to source 140 and drain 160, such that when a voltage difference exists between source 140 and drain 160, current will tend to flow through channel 120. The semiconducting characteristics of channel 120 are altered such that its resistivity may be controlled by the voltage applied to gate 190, a conductive layer overlying channel 120. Thus by changing the voltage on gate 190, more or less current can be made to flow through channel 120. Gate 190 and channel 120 are separated by gate dielectric 180; the gate dielectric is insulating, such that between gate 190 and channel 120 little or no current flows during operation (although "tunneling" current is observed with thin dielectrics). However, the gate dielectric allows the gate voltage to induce an electric field in channel 120, giving rise to the name "field effect transistor."

Generally, integrated circuit performance and density may be enhanced by "scaling", that is by decreasing the size of the individual semiconductor devices on a chip. Unfortunately, field effect semiconductor devices produce an output signal that is proportional to the length of the channel, such that scaling reduces their output. This effect has generally been compensated for by decreasing the thickness of gate dielectric 180, thus bringing the gate in closer proximity to the channel and enhancing the field effect.

As devices have scaled to smaller and smaller dimensions, the gate dielectric thickness has continued to shrink. Although further scaling of devices is still possible, scaling of the gate dielectric thickness has almost reached its practical limit with the conventional gate dielectric material, silicon dioxide. Further scaling of silicon dioxide gate dielectric thickness will involve a host of problems: extremely thin layers allow for large leakage currents due to direct tunneling through the oxide. Because such layers are formed literally from a few layers of atoms, exacting process control is required to repeatably produce such layers. Uniformity of coverage is also critical because device parameters may change dramatically based on the presence or absence of even a single monolayer of dielectric material. Finally, such thin layers form poor diffusion barriers to impurities.

Realizing the limitations of silicon dioxide, researchers have searched for alternative dielectric materials which can be formed in a thicker layer than silicon dioxide and yet still produce the same field effect performance. This performance is often expressed as "equivalent oxide thickness": although the alternative material layer may be thick, it has the equivalent effect of a much thinner layer of silicon dioxide (commonly called simply "oxide"). Many, if not most, of the attractive alternatives for achieving low equivalent oxide thicknesses are metal oxides, such as tantalum pentoxide, titanium dioxide, and barium strontium titanate.

Researchers have found formation of such metal oxides as gate dielectrics to be problematic. At typical metal oxide deposition temperatures, the oxygen ambient or oxygen-containing precursor required to form them tends to also oxidize the silicon substrate, producing an oxide layer at the interface between the substrate and the gate dielectric. The presence of this interfacial oxide layer increases the effective oxide thickness, reducing the effectiveness of the alternative gate dielectric approach. The existence of the interfacial oxide layer places an ultimate constraint on the performance of an alternative dielectric field effect device.

SUMMARY OF THE INVENTION

The present invention includes a semiconductor device structure utilizing either a zirconium oxynitride or a hafnium oxynitride gate dielectric layer, and a method for making the same. This method also encompasses gate dielectrics formed from oxynitrides of mixtures of Zr and Hf. With the present invention, a zirconium (or hafnium) oxynitride gate dielectric may be formed with a dielectric constant substantially higher than that of either conventional thermal silicon dioxide or silicon nitride dielectrics. Thus, the metal (Zr or Hf) oxynitride dielectric layer may be made substantially thicker than a conventional gate dielectric with equivalent field effect. Additionally, the presence of nitrogen, in at least a partial thickness of the gate dielectric, helps to prevent the diffusion of boron, such as from a boron-doped polysilicon gate electrode, to the channel region.

Conventional researcher wisdom has been to avoid nitrogen-based compounds for gate dielectrics. Additionally, integrated circuit manufacturing researchers tend to hesitate before investigating the addition of new materials, and especially material types, for mass produced integrated circuits. In spite of this, our investigations suggest that $HfO_xN_y$ and $ZrO_xN_y$ (with relatively small N levels) are stable next to Si, so there will not be a reaction to form $SiO_2$ (silicon oxide reactions are at least minimized to the extent that the dielectric properties are not substantially corrupted). Combining this, and the high permittivities achievable, with our research into understanding the silicon/oxynitride interface has allowed us to recognize the usability of zirconium oxynitride and hafnium oxynitride gate dielectrics.

In one embodiment, a graded zirconium (or hafnium) oxynitride layer is formed, such that near the silicon interface the dielectric layer has a large oxynitride component, while the upper portion of the oxynitride layer has a large zirconium component. Such a structure may employ primarily silicon/oxynitride bonding at the silicon interface, with acceptable interface state densities. However, the zirconium and/or hafnium included in the oxynitride layer can significantly increase the dielectric constant of the film. The present invention also provides for amorphous gate dielectrics, which have dense microstructures and avoid many of the problems associated with grain boundaries in polycrystalline dielectrics.

In one aspect of this invention, a method of fabricating a semiconductor device is disclosed that includes providing a single-crystal silicon substrate, which usually includes structures, such as a channel region; forming a metal oxynitride gate dielectric layer on the substrate, and forming a conductive gate overlying the gate dielectric layer. This metal can be Zr, hafnium, or a mixture of the two. Suitable base layers for the metal oxynitride layer include bare silicon, silicon oxynitride, and other passivated Si layers, such as hydrogen terminated Si. These other passivation schemes may require removal of the passivant before formation of the zirconium oxynitride.

In one zirconium-based approach, the zirconium oxynitride dielectric layer is formed by forming zirconium on the substrate, and annealing the formed metal in an atmosphere including oxygen and nitrogen, thus forming a metal oxynitride layer on the substrate. In some embodiments, the atmosphere includes NO, or a remote nitrogen/oxygen plasma.

In another zirconium-based approach, the zirconium oxynitride dielectric layer is formed by forming zirconium on the substrate, and annealing the formed metal in a non-oxidizing atmosphere including nitrogen, such as atomic nitrogen or $NH_3$, and annealing this zirconium-nitride layer in oxygen to form a zirconium oxynitride layer.

In another zirconium-based approach, the zirconium (or hafnium) oxynitride dielectric layer is formed by depositing zirconium or hafnium on the substrate in an atmosphere including oxygen and nitrogen, thus forming a metal oxynitride layer on the substrate. In some embodiments, the atmosphere includes NO, or $N_2O$.

BRIEF DESCRIPTION OF THE DRAWINGS

This invention, including the features and advantages thereof, can be best understood by reference to the following drawings, wherein.

DETAILED DESCRIPTION OF THE PREFERRED EMBODIMENTS

This application describes the embodiments in terms of a zirconium oxynitride dielectric. However, due to its chemical similarity, hafnium can be used in place of zirconium in most of these embodiments. Additionally, hafnium-zirconium mixtures can be used in place of either. In some embodiments, these mixtures will be substantially pure Zr or Hf, with only small amounts of Hf or Zr included. In general, both zirconium oxynitride and hafnium oxynitride provide high dielectric constants and good chemical stability. In some embodiments, Zr will be preferred due to its higher availability and lower cost. However, hafnium oxynitride has a somewhat higher dielectric constant and may be more stable than zirconium oxynitride. This slight performance edge may lead to a preference for hafnium oxynitride in some applications.

Figure 1:
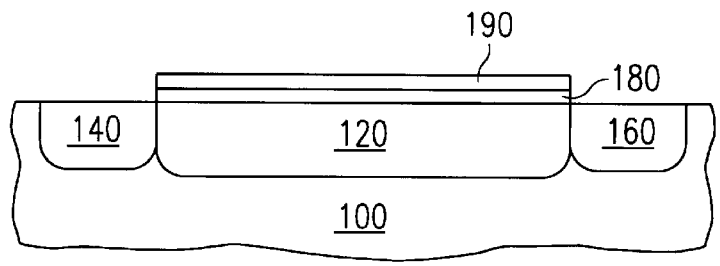
FIG. 1 is a cross-sectional view of a typical prior art integrated circuit field effect transistor.
Figure 2:
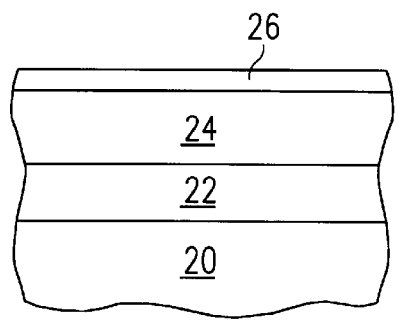
FIGS. 2–5 are cross-sectional views of several semiconductor devices, illustrating different surfaces appropriate for deposition of a zirconium oxynitride gate dielectric according to the invention.

The preferred embodiments of the invention may be fabricated on a silicon substrate, as described herein. Although it is not required to practice this invention, it is conventional to use a Si(100) substrate. The description of these embodiments begins, as shown if FIG. 2, after formation of an optional epitaxial Si layer 22 on substrate 20 and implantation of an active channel region 24 in epitaxial layer 22 (or substrate 20, if no epi-layer is used). The description assumes that a protective or native silicon oxide region 26 (preferably comprising less than 1 nm of oxide) overlies channel 24 in the region of interest. Such a silicon oxide layer may be formed by heating a clean substrate to 600–700° C. for approximately 30 seconds, in an oxygen ambient of ~$10^{-3}$ Torr. Processes for reaching this step in fabrication are all well known in the art, as are various equivalents to which the present invention is applicable.

The particular embodiment employed for forming a zirconium oxynitride gate dielectric will dictate whether silicon oxide region 26 will be either left in place and used in the formation of an interfacial silicon-oxynitride layer, removed such that the dielectric layer may be directly formed on the underlying silicon, or removed and replaced with a passivation layer designed to inhibit interaction of the substrate in the zirconium oxynitride deposition process.

Figure 3:
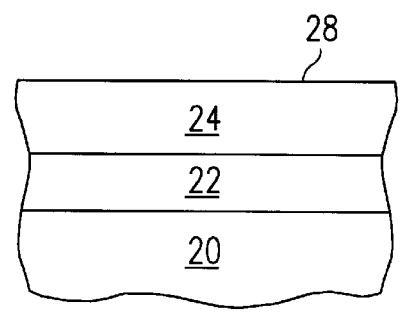
Figure 4:
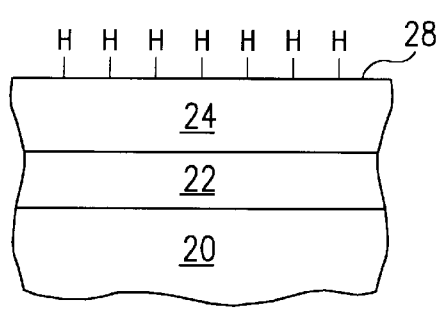

The immediately following description relates to the preparation of the substrate for deposition of oxynitride-forming materials, and is applicable to the specific embodiments presented thereafter. There are two preferred starting surfaces for the invention if silicon oxide region 26 is to be removed. Region 26 may be removed so as to leave either a clean, bare upper surface 28 as shown in FIG. 3, or a hydrogen-terminated surface 28 as shown in FIG. 4. If oxide region 26 is removed, the bare surface is preferred to the hydrogen-terminated surface if chemical reaction of the highly reactive bare Si surface can be prevented, e.g. by processing in ultrahigh (less than ~$10^8$ Torr) vacuum until a point in the particular process where exposure to oxygen can be tolerated. Otherwise, the bare Si surface should be terminated with a suitable passivant, such as hydrogen, which inhibits reoxidation, yet may be readily removed at an appropriate point in the process.

The method of oxide removal is not believed to be critical to the practice of the invention, as long as a clean, oxide-free surface 28 can be maintained until an overlying deposition is performed. One preferred method of performing removal of oxide 26 is by exposure to wet HF, for example by dipping the substrate in dilute HF for 30 seconds and rinsing in deionized water. This both removes the native oxide and hydrogen terminates the surface. Another preferred method is by exposure to HF vapor; this provides similar results, but may be used, e.g., in a cluster tool to further prevent reoxidation or contamination of the surface. Either of these approaches may include other appropriate stripping chemicals, with HF or a $NH_4F$ solution being preferred as a last step to provide termination.

Several other methods produce a non-terminated surface 28, as shown in FIG. 3. One such method with particular applicability to cluster-tool practice is Si flux desorption. It has been found that below $10^{-8}$ Torr and at 780° C., an Si flux of preferably 1.5 Å/sec for about 600 seconds not only removes native oxide, but produces an atomically smooth, stepped surface that may have advantages for ultrathin gate dielectrics. The alternative is simple desorption by heating of the substrate to high temperature in vacuum or in an $H_2$ ambient. It is believed, however, that the Si-flux method results in a superior surface structure. In any of these methods, if the substrate will not be kept in ultrahigh vacuum until an overlying deposition is completed, surface 28 may be hydrogen terminated, e.g. by exposure to atomic hydrogen produced by a plasma or hot filament in an $H_2$ ambient.

Surface 28 may also be passivated with an ultrathin layer, such as a silicon nitride or silicon oxynitride layer, that is not, strictly speaking, an oxide of silicon. Such layers act as a diffusion barrier and provide oxidation resistance to the substrate during formation of the overlying layer. If an oxynitride layer is used, the preferred method of oxynitridation is by exposure to NO. This layer is preferably less than 1 nm thick, and more preferably less than 0.5 nm thick. Although the reasons are not well understood, this ultrathin passivation layer greatly reduces oxidation of the silicon substrate during formation of an oxygen-bearing gate dielectric.

Although the effective dielectric constant of an oxynitride layer is difficult to measure, it is believed to be in the range of 5 to 6. Thicknesses less than 0.5 nm are even more preferred, in order to lessen the effect of the passivation layer's relatively lower dielectric constant on equivalent oxide thickness. Because nitrogen incorporation is believed to be important to the effectiveness of the oxynitride layer as an oxidation barrier, it may be advantageous to post-anneal a NO-formed oxynitride layer in an ambient that provides atomic nitrogen.

Oxynitrides produced by other methods are not believed to provide sufficient oxidation resistance at the required thicknesses to complete some of the gate dielectric structures disclosed herein, and/or require higher process temperatures, and as such are not preferred. For instance, $N_2O$ processes result in a much smaller incorporation of N than NO processes. $NH_3$ processes require a pre-existing $SiO_2$ film, and thus a uniform sub-nanometer oxynitride film appears to be difficult to achieve using $NH_3$. Additionally, $NH_3$ annealing apparently incorporates undesirable hydrogen into the film structure.

Figure 5:
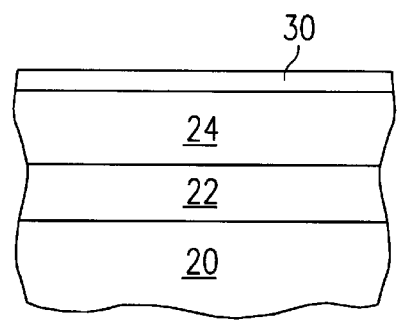

A typical NO process applicable to the present invention is as follows. The substrate is cleaned to remove the pad oxide. As a final step in the cleaning, the substrate is dipped in dilute HF for 30 seconds, and rinsed in deionized water. The substrate is then placed in a reaction chamber, which is then evacuated to $3\times10^{-8}$ Torr, and then the substrate is heated to 500° C. to remove the hydrogen passivation from the substrate surface. The substrate is heated to 700° C., and NO at 4 Torr is introduced into the chamber for 10 seconds to form the oxynitride passivation layer. FIG. 5 depicts a passivation layer 30, e.g., typically an oxynitride, but possibly a nitride passivation layer.

Once the substrate has been prepared to provide either a clean Si surface, an oxide layer, or a protective barrier layer as described above, a zirconium (or hafnium) oxynitride gate dielectric is formed on the substrate by one of several methods. Several of these methods are described below.

We chose zirconium oxynitride and hafnium oxynitride due to their stability next to silicon and higher permittivity. Based on the silicate and oxide data, we believe that these metal oxynitride's heat of formation is more negative than the heat of formation of silicon dioxide and that their permittivity is higher than either $SiO_2$ or silicon nitride. This should form a more stable gate structure and avoid the preferential formation of interfacial silicon dioxide. Table 1 lists the heat of formation, permittivity, and bandgap of several materials, with silicon dioxide included for comparison purposes.

TABLE 1

| Material | Bulk Permittivity | Bandgap (eV) | Heat of Formation (kcal/g/atom of O) |
|---|---|---|---|
| $Y_2O_3$ | 12 | | −152 |
| CaO | | 7 | −152 |
| MgO | 9.6 | 7.8 | −144 |
| $La_2O_3$ | 30 | | −143 |
| SrO | | 5.8 | −142 |
| $Ca_3SiO_5$ | | | −138 |
| $Sc_2O_3$ | | | −137 |
| $Ca_2SiO_4$ | | | −135 |
| $HfO_2$ | 40 | | −134 |
| $ZrO_2$ | 25 | 7.8 | −131 |
| $CeO_2$ | 26 | | −129 |
| $Al_2O_3$ | 10 | 8.7 | −125 |
| $Ba_2SiO_4$ | | | −124 |
| $CaSiO_3$ | | | −123 |
| $SrSiO_3$ | | | ~−123 |
| $Mg_2SiO_4$ | | | −122 |
| $Na_2SiO_3$ | | | −121 |
| $BaSiO_3$ | | | −120 |
| $MgSiO_3$ | | | −119 |
| $ZrSiO_4$ | | | −115 |
| $CeSiO_4$ | | | ~−115 |
| $Bi_4Si_2O_{12}$ | 35–75 | | |
| $TiO_2$ | 30 | 3–3.5 | −110 |
| $SiO_2$ | 3.9 | 8.9–9.3 | −103 |
| $Ta_2O_5$ | 26 | 4.5 | −100 |
| ZnO | 4.6 | 3.3 | −84 |
| $WO_3$ | 42 | | −66.9 |
| CuO | | | −37.6 |
| PdO | | | −21 |

The zirconium oxynitride may be formed as either a polycrystalline or an amorphous film. Generally, polycrystalline films will have better dielectric constant. However, amorphous films generally have higher breakdown performance, form a better diffusion barrier, and have lower interface state densities. Also, with many of the embodiments for formation of a zirconium oxynitride dielectric according to the present invention, formation of an amorphous film may be easier than formation of a polycrystalline film because of the uniform stoichiometry required for a polycrystalline film.

Embodiment 1

In one embodiment according to the invention, a zirconium or hafnium oxynitride gate dielectric is formed by depositing Zr or Hf on a clean Si surface, oxynitridating this metal layer, and annealing this structure. In this embodiment, a substrate such as shown in either FIG. 3 or FIG. 4 is used. If surface 28 is hydrogen passivated as shown in FIG. 4, the substrate can be briefly heated to above 500° C. in vacuum or an inert ambient to remove the passivation.

Figure 6:
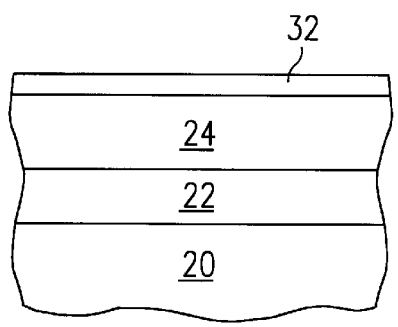
FIGS. 6–12 are cross-sectional views of a semiconductor device during fabrication according to various embodiments of the invention.

Referring to FIG. 6, a metal layer 32 (e.g. zirconium) is deposited directly on surface 28, e.g. by sputtering, evaporation, chemical vapor deposition (CVD) or plasma CVD. The figures show that surface 28 is the surface of channel region 24. However, formation of a metal oxynitride layer on the surface of epitaxial layer 22 or substrate 20 follows the same method. Layers 20 and 24 will be used interchangeably below, except where the context shows a distinction is meant.

Sputter deposition is preferably done with a low-energy plasma system, such as collimated or long-throw sputtering. Low deposition rates (e.g. on the order of a few angstroms per second) may be useful, as the total thickness to be deposited is small and uniformity is desired. For an 8" wafer, deposition may be completed in a system with a base pressure of ~$10^{-8}$ Torr, an operating pressure of ~$10^{-3}$ Torr, and a separation between the sputter gun and the wafer of 16 inches, and the wafer may be rotated to improve uniformity. Ar is an acceptable sputter gas, and the wafer may be maintained at a temperature of 400–600° C. during deposition.

As an alternative to sputtering, metal layer 32 may be deposited by evaporation from an e-beam source onto a substrate at 500–600° C., with a net deposition rate on the order of tenths of angstroms to a few angstroms per second. The substrate is preferably rotated to improve uniformity.

Other alternative methods include CVD or plasma CVD using appropriate precursors, such as zirconium tetrachloride (or. hafnium tetrachloride) and hydrogen gas. Nitrogen-bearing zirconium (or hafnium) precursors, such as a Zr (or Hf) nitrate, would also be acceptable. Again, with these methods low deposition rates and temperatures 600° C. and lower) can be useful, and a downstream plasma type reactor is preferred to a reactor where the plasma is generated at the substrate.

Figure 8:
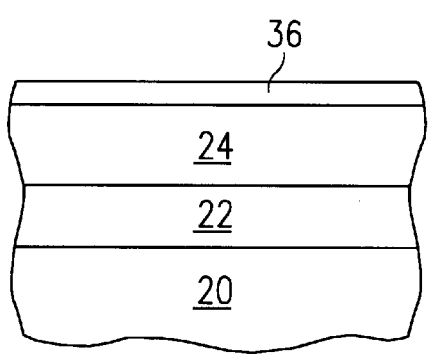

Referring now to FIG. 8, metal layer 32 is converted to a zirconium (or hafnium) oxynitride layer 36 by oxynitridation. Process control is critical during this step, as under-oxynitridation will result in decreased resistivity and diffusion resistance and over-oxynitridation may result in decreased capacitance for layer 36 (due to oxidation of the underlying silicon). Several processes are available for this step. The metal can be converted into zirconium (or hafnium) oxynitride by direct exposure to an oxygen/nitrogen atmosphere, such as NO or $N_2O$. Alternatively, a low temperature remote $N_2/O_2$ plasma can also be used.

One alternative to direct conversion in an oxynitride atmosphere is nitridation in a nitrogen ambient, such as a remote plasma of nitrogen (preferred) or $NH_3$, followed by oxidation. Many oxygen anneal processes are available for this step, such as a low temperature $O_2$ anneal with or without ultraviolet exposure, or an activated oxygen anneal such as $O_3$, $O_3$ with ultraviolet exposure, a downstream $O_2$ plasma, $N_2O$, or a low temperature $O_2$ plasma with a DC-biased substrate. As an example of this last process, a downstream 1500 W ECR source operating at 1 mTorr, coupled with ~60V DC and 13.56 MHz or 300 kHz RF applied to the substrate may be used while He backside cooling at 80° C. is also applied to the substrate. Processing time is determined experimentally such that both resistivity and dielectric constant lie within an acceptable range.

Generally, a high temperature anneal of zirconium (or hafnium) oxynitride layer 36 is selected to densify or crystallize the film after low temperature oxynitridation. For example, the substrate may be densified by annealing in Ar for 20 seconds at 750° C. This anneal may be done in either an inert or a reducing environment, with a reducing environment particularly useful where metal layer 32 was deposited by CVD using halogens. If a reducing environment is used, an additional low-temperature post-anneal in oxygen may be used to improve dielectric properties of the zirconium (or hafnium) oxynitride layer 36.

Figure 9:
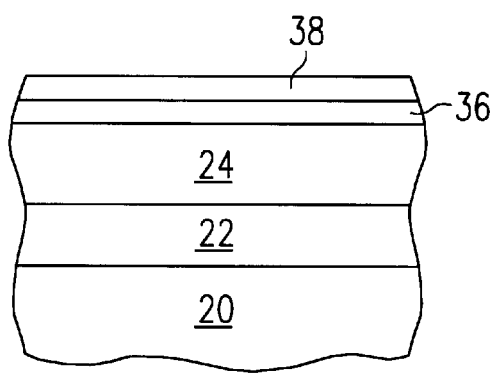

Finally, with reference to FIG. 9, conductive gate 38 is deposited over the zirconium oxynitride gate dielectric 36. Processes for depositing gate 38 are well known in the art; gate 38 may be formed, by way of example, of doped polysilicon, metal, or a conductive metal oxide.

In other approaches, polysilicon gates often require an additional passivation layer between dielectric 36 and gate 38 to prevent reduction of dielectric 36 and oxidation of gate 38 at the interface. Although a passivation layer is allowable, the polysilicon reaction with the underlying zirconium oxynitride tends to form an interfacial zone of zirconium silicon-oxynitride, which will not destroy the dielectric properties of the layer. Thus, many of the compatibility benefits obtained at the bottom interface are also available at the top interface. Additionally, the nitrogen in the dielectric 36 will greatly reduce boron migration through the dielectric 36 to the substrate when a polysilicon gate is doped.

Embodiment 2

In a second embodiment according to the invention, a zirconium (or hafnium) oxynitride gate dielectric is formed by depositing zirconium (or hafnium) on a substrate in an oxygen/nitrogen ambient, followed by annealing. This embodiment preferably utilizes a substrate prepared by one of the methods corresponding to FIGS. 2, 3, or 4, and the metal may be deposited by one of the methods described in embodiment 1, with the following differences.

Figure 10:
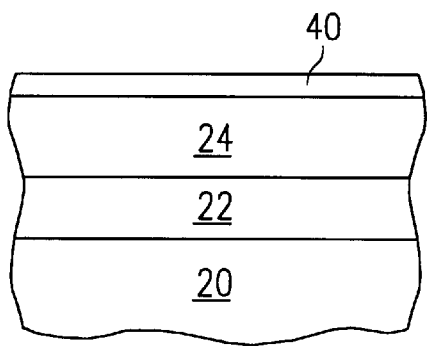

Referring to FIG. 10, an oxynitrided zirconium layer 40 may be deposited on a clean Si surface by sputtering Zr or Hf, as described above. However, some amount of controlled oxygen and nitrogen activity is used to at least partially oxidize-nitridize layer 40 as zirconium is supplied to the substrate. For example, NO or $N_2O$ may be introduced near the substrate during sputtering with Ar, with a NO flow rate of about one-tenth that of the Ar flow rate. For a metal deposition rate of 0.1 nanometers per second, the oxynitridation gas is preferably introduced from 0 to 5 seconds after the start of the deposition process. This time delay (if present) will help prevent formation of an interfacial $SiO_2$ layer.

If the zirconium is introduced by the evaporation method, the oxynitridation gas is preferably added near the substrate. To achieve near complete oxynitridation of the deposited metal, ~5–10 Torr of NO may be used for a metal deposition rate of 0.1 nm/sec. If a CVD method is used, appropriate precursors should provide the necessary oxygen (e.g. zirconium tetrachloride and water), and may provide the nitrogen. For a non-nitrogen-bearing precursor, the nitrogen can be provided by a post-deposition nitridation with a nitrogen source such as a remote nitrogen plasma, NO, $N_2O$, or $NH_3$.

Although this zirconium oxynitride layer will likely react with the underlying Si (either during deposition or during later manufacturing), the resulting zirconium silicon-oxynitride interfacial layer should not present a significant problem for most applications.

Figure 12:
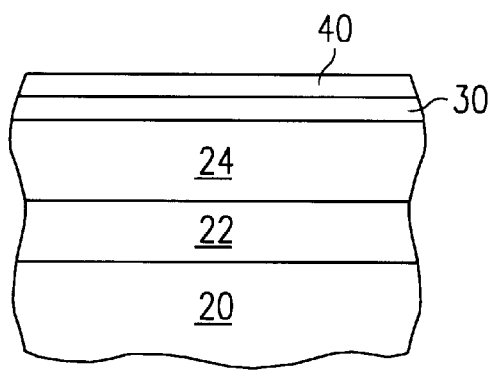

In some applications, it may be desirable to increase the thickness of this interfacial zirconium silicon-oxynitride layer. In this approach, the reactions between the zirconium oxynitride and the underlying layer can produce a graded layer. One variation on this method is shown in FIG. 12, wherein layer 40 is deposited over a silicon oxynitride layer 30. In such an embodiment, oxygen/nitrogen activity during the anneal may be reduced, and an interfacial zirconium silicon-oxynitride layer 36 may be formed by "stealing" oxygen, nitrogen, and silicon from layer 30 and/or "giving" Zr to the silicon-oxynitride layer 30. The grading of the structure may be adjusted by adjusting the relative initial thicknesses of layers 30 and 40.

An alternative method for forming a thicker zirconium silicon-oxynitride interfacial layer is to start the NO before the metal deposition. In this process, the initial NO starts to form a thin silicon oxynitride layer. Introduction of the metal starts the formation of a zirconium oxynitride layer. After annealing, diffusion causes a zirconium silicon-oxynitride interfacial layer. The thickness and gradient of the interfacial layer can be changed by varying the time before starting the metal deposition.

Embodiment 3

In a third embodiment according to the invention, a zirconium (or hafnium) oxynitride dielectric is formed by depositing a metal oxide on the substrate, followed by nitridation. This approach sometimes works better than the silicide approaches above, since the deposited layer is not in a highly reduced (i.e. oxygen deficient) state.

Oxynitrides formed according to this embodiment may be formed on a substrate prepared according to FIGS. 3, 4, or 5.

Figure 7:
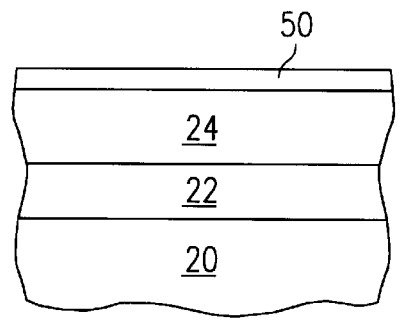

Referring to FIG. 7, a zirconium oxide layer 50 may be deposited on a clean Si surface by sputtering a metal oxide, such as $ZrO_2$ or $HfO_2$. As an alternative to sputtering, this metal oxide layer 50 may be deposited by evaporation onto the substrate at 500–600° C., with a net deposition rate on the order of tenths of angstroms to a few angstroms per second. The substrate is preferably rotated to improve uniformity.

Figure 11:
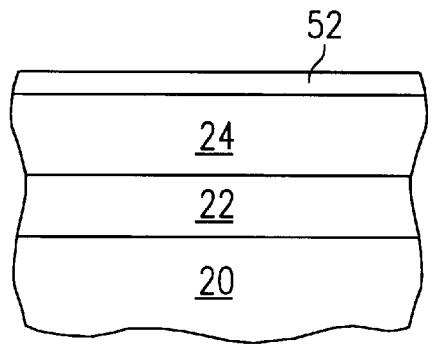

Referring now to FIG. 11, partially reduced zirconium oxide layer 50 is converted to zirconium oxynitride layer 52 by nitridation. In this method, we sometimes prefer nitridation with a remote plasma of nitrogen. However, some artisans may prefer exposure to NO, and may even find acceptable results by nitriding with $N_2O$ or $NH_3$.

Post-anneals in $O_2$ at about 400–550° for up to about 30 minutes generally increase capacitance while maintaining low leakage current. Anneals at higher temperatures or longer times tend to degrade capacitance. Many oxygen anneal processes are available for this step, such as a low temperature $O_2$ anneal, with or without ultraviolet exposure, or an activated oxygen anneal such as $O_3$, $O_3$ with ultraviolet exposure, a downstream $O_2$ plasma, $N_2O$, or a low temperature $O_2$ plasma with a DC-biased substrate. As an approximate example of this last process, a downstream 1500 W ECR source operating at 1 mTorr, coupled with ~60V DC and 13.56 MHz or 300 kHz RF applied to the substrate may be used while He backside cooling at 80° C. is also applied to the substrate. Processing time is determined experimentally such that both resistivity and dielectric constant lie within an acceptable range.

Often, it will be desirable to practice a post-formation anneal as described in the first embodiment.

In the approaches mentioned above, it may sometimes be preferable to slow the reactions between the zirconium (or hafnium) oxynitride and the underlying silicon. In these cases, it can be useful to first form a thin silicon oxynitride passivation layer, as described above, on the silicon surface. The zirconium silicon-oxynitride layer can then be formed on this passivation layer with one of the methods described above.

The present invention is not limited by the specific embodiments described herein. Although a particular substrate and type of device have been described herein for clarity, this invention has application to Si-based devices generally which modify the semiconducting characteristics of an active region using the field effect of an overlying conductive region. Various other combinations of the described steps may be used to produce zirconium (or hafnium) oxynitride gate dielectrics, and such are intended to fall within the scope of this invention.

This disclosure has concentrated on gate dielectrics. However, if the leakage current is suitably low, most gate dielectrics can be used as storage dielectrics in a memory cell. It should be noted, that in general, memory dielectrics are not suitable for use as gate dielectrics. This unsuitability is due to the much more demanding interface characteristics that gate dielectrics usually require. With a zirconium (or hafnium) oxynitride dielectrics, the leakage currents can be reduced to acceptable levels by increasing the oxidation time (i.e., the oxygen content of the metal oxynitride). Although this increased oxygen content slightly decreases the permittivity of the overall structure, the overall dielectric constant is still significantly above current technologies. It should be noted that the physical vapor deposition (PVD) methods above (sputtering and evaporation) typically do not provide a highly conformal layer. Thus, when using one of these PVD methods above for storage dielectric applications, it may not be practical to use this on enhanced surface area geometries, such as rugged polysilicon. However, the high permittivity of zirconium oxynitride allows artisans to manufacture useful, high energy storage, capacitors, without complex surface area enhancement schemes.

What is claimed is:

1. An integrated circuit having a field effect device fabricated thereon, the field effect device comprising:
    a single-crystal silicon semiconducting channel region;
    a metal oxynitride gate dielectric overlying the channel region where the metal is selected from the group of hafnium, zirconium, and mixtures thereof; and
    a conductive gate overlying the gate dielectric;
    wherein the gate dielectric is amorphous.

2. An integrated circuit having a field effect device fabricated thereon, the field effect device comprising:
    a single-crystal silicon semiconducting channel region;
    a metal oxynitride gate dielectric overlying an interfacial layer of metal silicon-oxynitride between the metal oxynitride gate dielectric and the silicon channel region;
    where the metal is selected from the group of hafnium, zirconium, and mixtures thereof; and
    a conductive gate overlying the gate dielectric.

3. An integrated circuit having a field effect device fabricated thereon, the field effect device comprising:
    a single-crystal silicon semiconducting channel region;
    a metal oxynitride gate dielectric overlying a first interfacial layer of metal silicon-oxynitride between the metal oxynitride gate dielectric and the silicon channel region;
    where the metal is selected from the group of hafnium, zirconium, and mixtures thereof; and
    a conductive gate overlying the gate dielectric;
    where the conductive gate includes polysilicon; and
    including a second interfacial layer of metal silicon-oxynitride between the metal oxynitride gate dielectric and the polysilicon conductive gate.

4. The integrated circuit of claim 1, wherein the single-crystal silicon semiconducting channel region is part of an epitaxial layer.

5. The integrated circuit of claim 1, wherein the single-crystal silicon semiconducting channel region is part of a silicon substrate.

6. The integrated circuit of claim 1, wherein the single-crystal silicon semiconducting channel region is part of a Si (100) substrate.

7. The integrated circuit of claim 1, wherein the metal is zirconium.

8. The integrated circuit of claim 1, wherein the metal is hafnium.

9. The integrated circuit of claim 2, wherein the single-crystal silicon semiconducting channel region is part of an epitaxial layer.

10. The integrated circuit of claim 2, wherein the single-crystal silicon semiconducting channel region is part of a silicon substrate.

11. The integrated circuit of claim 2, wherein the single-crystal silicon semiconducting channel region is part of a Si (100) substrate.

12. The integrated circuit of claim 2, wherein the interfacial layer of metal silicon-oxynitride is a graded layer.

13. The integrated circuit of claim 2, wherein the metal is zirconium.

14. The integrated circuit of claim 2, wherein the metal is hafnium.

15. The integrated circuit of claim 3, wherein the single-crystal silicon semiconducting channel region is part of an epitaxial layer.

16. The integrated circuit of claim 3, wherein the single-crystal silicon semiconducting channel region is part of a silicon substrate.

17. The integrated circuit of claim 3, wherein the single-crystal silicon semiconducting channel region is part of a Si (100) substrate.

18. The integrated circuit of claim 3, wherein the first interfacial layer of metal silicon-oxynitride is a graded layer.

19. The integrated circuit of claim 3, wherein the metal is zirconium.

20. The integrated circuit of claim 3, wherein the metal is hafnium.

* * * * *